United States Patent [19]
Torczynski

[11] Patent Number: 6,165,267
[45] Date of Patent: Dec. 26, 2000

[54] SPIN COATING APPARATUS

[75] Inventor: John R. Torczynski, Albuquerque, N. Mex.

[73] Assignee: Sandia Corporation, Albuquerque, N. Mex.

[21] Appl. No.: 09/167,885

[22] Filed: Oct. 7, 1998

[51] Int. Cl.[7] .............................. B05C 13/02; B05D 3/02; B08B 3/08; B03D 5/04
[52] U.S. Cl. .............................. 118/500; 118/52; 118/320; 118/501; 134/153; 134/902; 137/8; 396/611; 396/627; 427/240
[58] Field of Search ................................ 118/52, 56, 319, 118/320, 500, 501; 134/153, 902; 427/9, 240, 600; 396/611, 627; 137/8

[56] References Cited

U.S. PATENT DOCUMENTS

| | | | |
|---|---|---|---|
| 5,289,222 | 2/1994 | Hurtig | 554/317 |
| 5,366,757 | 11/1994 | Lin | 427/9 |
| 5,378,511 | 1/1995 | Cordinali et al. | 427/600 |
| 5,449,405 | 9/1995 | Cordinali et al. | 118/50 |
| 5,562,772 | 10/1996 | Neoh | 118/52 |

FOREIGN PATENT DOCUMENTS

63-076431  4/1988  Japan .

*Primary Examiner*—Laura Edwards
*Assistant Examiner*—J. A. Lorengo
*Attorney, Agent, or Firm*—V. Gerald Grafe; Kevin Bieg

[57] ABSTRACT

A spin coating apparatus requires less cleanroom air flow than prior spin coating apparatus to minimize cleanroom contamination. A shaped exhaust duct from the spin coater maintains process quality while requiring reduced cleanroom air flow. The exhaust duct can decrease in cross section as it extends from the wafer, minimizing eddy formation. The exhaust duct can conform to entrainment streamlines to minimize eddy formation and reduce interprocess contamination at minimal cleanroom air flow rates.

6 Claims, 14 Drawing Sheets

SPIN COATING APPARATUS

This invention was made with Government support under Contract DE-AC04-94AL85000 awarded by the U.S. Department of Energy. The Government has certain rights in the invention.

BACKGROUND OF THE INVENTION

This invention relates to the field of spin coating, specifically spin coating apparatus commonly used in semiconductor fabrication.

Figure 1:
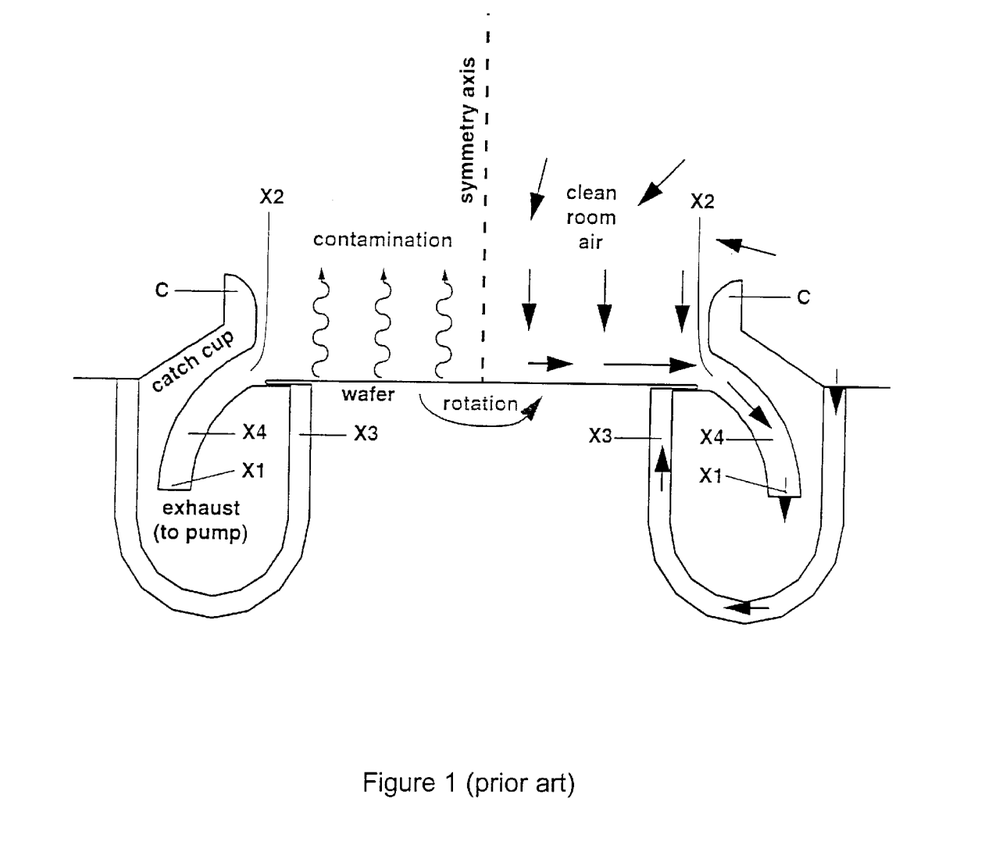
FIG. 1 is a sectional view of a conventional spin coating apparatus.

In the semiconductor processing industry, materials such as photoresist are commonly applied to semiconductor wafers using a spin coating apparatus. See Neoh, U.S. Pat. No. 5,562,772; Cardinali, U.S. Pat. No. 5,449,405; Cardinali, U.S. Pat. No. 5,378,511; Lin, U.S. Pat. No. 5,366,757; Hurtig, U.S. Pat. No. 5,289,222. The wafer is placed on a flat vacuum chuck and spun while the material is applied through a nozzle near the center of the wafer. When the wafer is spun at high speed, centrifugal force causes the material to flow toward the circumference of the wafer, covering the wafer with a smooth, even coat of material. FIG. 1 shows a cross sectional view of a conventional spin coating apparatus.

During the spin coating process, a pump attached to exhaust port X1 draws cleanroom air into catch cup C, over the exposed wafer surface, into exhaust outlet X2, through exhaust duct X4 and out of the spin coating apparatus into the fab exhaust system. An additional flow path X3 allows cleanroom air to flow along the wafer underside into exhaust outlet X2 to minimize contamination of the wafer underside. Excess material is spun off the wafer into exhaust outlet X2, where it is trapped below the plane of the wafer surface. A primary concern is contamination of the cleanroom environment by material such as volatile photoresist solvent. Cleanroom air flow as described above can transport much of the excess material to exhaust outlet X2. With conventional spin coating apparatus, high cleanroom air flow rates can be required to prevent unacceptable cleanroom environment contamination. Cleanroom air is costly, however, and excessive cleanroom air flow contributes to excessive operating and environmental costs. Accordingly, there is a need for an improved spin coating apparatus that minimizes cleanroom contamination while requiring reduced cleanroom air flow.

SUMMARY OF THE INVENTION

A spin coating apparatus according to the present invention requires less cleanroom air flow than prior spin coating apparatus to minimize cleanroom contamination. A specially shaped exhaust duct from the spin coater maintains process quality while requiring reduced cleanroom air flow. The exhaust duct shape is such that the flow required for eddy-free flow therein is less than the flow required to maintain coating process quality. The required cleanroom air flow rate is consequently minimized. The exhaust duct can decrease in cross section as it extends from the wafer, minimizing eddy formation. The exhaust duct can conform to entrainment streamlines to minimize eddy formation and reduce interprocess contamination at minimal cleanroom air flow rates.

Advantages and novel features will become apparent to those skilled in the art upon examination of the following description or may be learned by practice of the invention. The objects and advantages of the invention may be realized and attained by means of the instrumentalities and combinations particularly pointed out in the appended claims.

DESCRIPTION OF THE FIGURES

The accompanying drawings, which are incorporated into and form part of the specification, illustrate embodiments of the invention and, together with the description, serve to explain the principles of the invention.

FIG. 2($a,b$) are sectional views of laminar and turbulent air flow over a surface of a rotating wafer.

FIG. 3($a,b,c$) are sectional views of streamlines in a spin coater at different pumping rates.

FIG. 5($a,b,c$) are sectional views of streamlines for conventional exhaust geometry and for exhaust geometry according to the present invention.

FIG. 8($a,b$) are schematic views of interprocess contaminant release.

FIG. 10($a,b$) are sectional views of exhaust duct geometries according to the present invention

DETAILED DESCRIPTION OF THE INVENTION

The present invention provides a spin coating apparatus that requires less cleanroom air flow than prior spin coating apparatus to minimize cleanroom contamination. The present invention comprises an exhaust path from the spin coater that requires minimum cleanroom air flow to obtain eddy-free flow. Certain process conditions are determined by the reliability and performance of the coating; analysis allowing selection of those process conditions is below. Once those process conditions are determined, then a shape for an exhaust path can be determined that allows the spin coating apparatus to operate at a minimum cleanroom air flow.

Two main parameters govern the gas flow in a spin coater: the pumping rate and the rotation rate. Appropriate, contemporary ranges for these parameters (shown in Table 1) with 200 mm wafers in air are pumping rates of 250–1000 liters per minute (lpm) and rotation rates of 0–5000 revolutions per minute (rpm). These ranges ensure coating quality with contemporary materials and process materials.

TABLE 1

| Quantity | Symbol | Value or range |
|---|---|---|
| Density | $\rho$ | 1.2 kg/m$^3$ |
| Viscosity, absolute | $\mu = \nu\upsilon$ | 0.0000185 kg/(m.s) |
| Viscosity, kinematic | $\upsilon = \mu\nu$ | 0.0000154 m$^2$/s |
| Wafer radius | R | 0.100 m |
| Rotation rate | $\Omega$ | 0–523.5 rad/s (0–5000 rpm) |
| Pumping rate | $V'_{pump}$ | 0.00417–0.01667 m$^3$/s (250–1000 lpm) |
| Contaminant diffusivity | D | <0.00005 m$^2$/s |

PHYSICAL PHENOMENA AFFECTING EXHAUST REQUIREMENTS

To preclude unacceptable levels of contaminant transport to the environment while minimizing the use of cleanroom air, eddy formation and turbulence can be avoided, and entrainment can be minimized. Eddies are stagnant regions of recirculating flow in which contaminants can be accumulated during the process and from which contaminants can be transported to the cleanroom environment during the process and interprocess periods. In the case of photoresist, this accumulation can be vapor or particles in the eddy or liquid or solid material on the wall adjacent to the eddy, which can release material into the eddy over time.

Turbulence is irregular fluctuating flow occurring at high flow speeds that enhances mixing and thereby enhances both contaminant transport and entrainment. Turbulence can occur over the wafer surface and in the exhaust outlet.

Entrainment is extra flow induced in otherwise quiescent fluid by the viscous or turbulent drag of an adjacent flow. The entrained flow is typically not useful because it does not contribute directly to the quality or cleanliness of a process. Note that turbulence and eddy formation are both undesirable from the viewpoint of process quality: turbulence over the wafer surface can degrade coating quality directly, and turbulence and eddy formation can enhance contaminant transport to the wafer surface as well as to the environment.

Figure 2A:
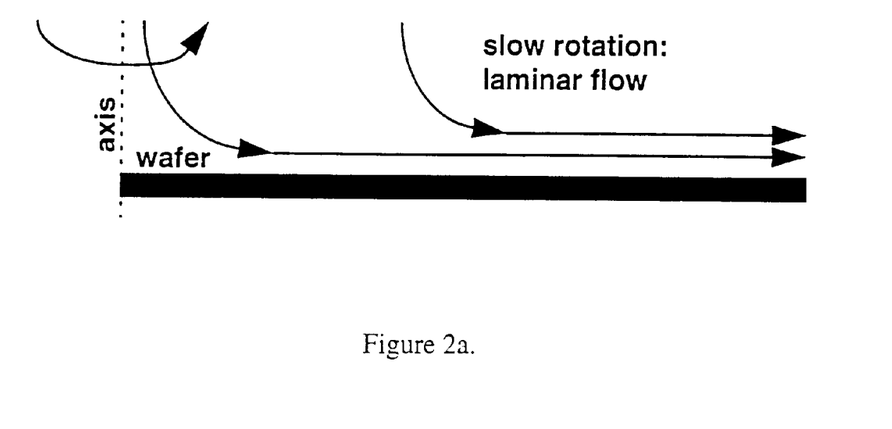
Figure 2B:
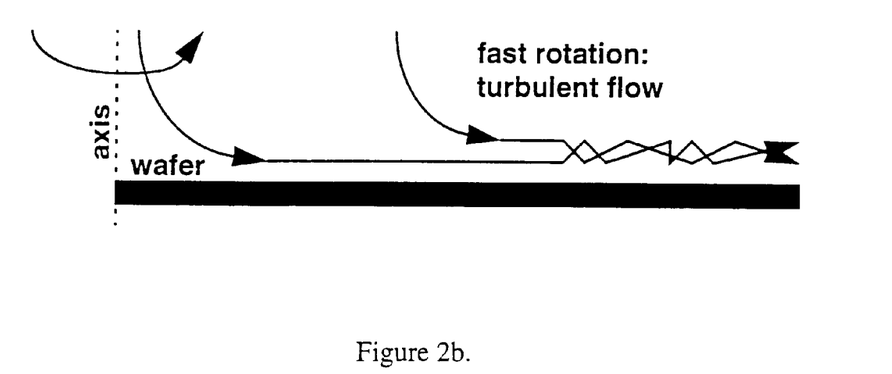

Avoiding turbulence can constrain spin coater operation. FIG. 2(a,b) shows a sectional view of laminar and turbulent flow over a rotating disk. To prevent turbulent flow over a rotating disk, the rotational Reynolds number $Re_{disk}$ must obey the constraint given in Equation 1. In Equation 1, $\Omega$ is the rotation rate, R is the disk radius, and v is the kinematic viscosity of air.

$$Re_{disk} = \frac{\Omega R^2}{v} < 3 \times 10^5 \qquad \text{Equation 1}$$

For 200 mm and 300 mm wafers in air, Equation 1 indicates rotation rates should be kept below 4400 rpm and 2000 rpm, respectively. Conventional practice typically satisfies these constraints.

Figure 3A:
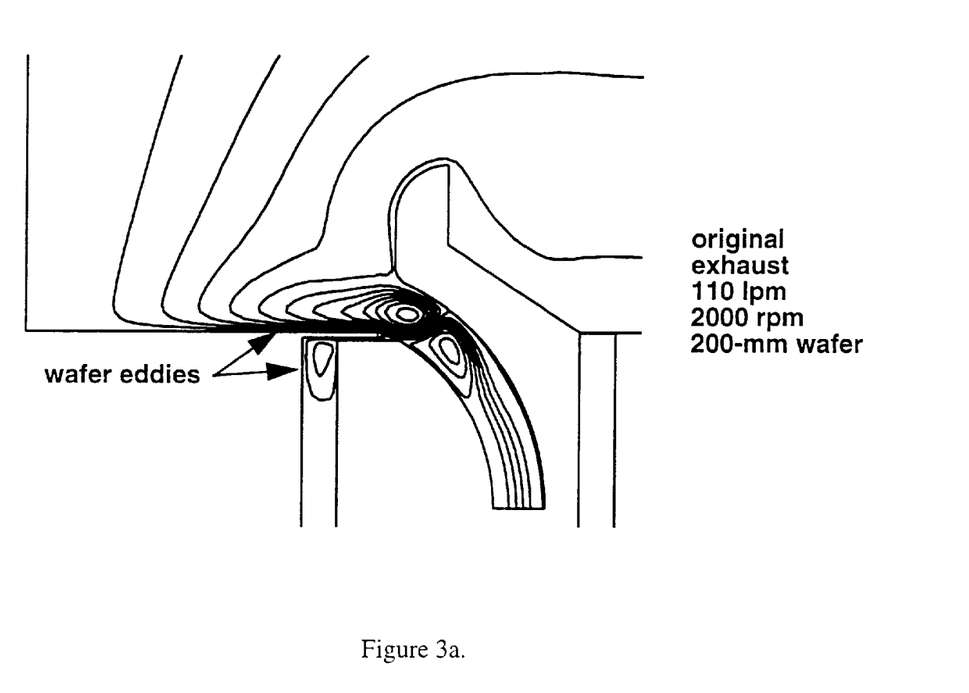
Figure 3B:
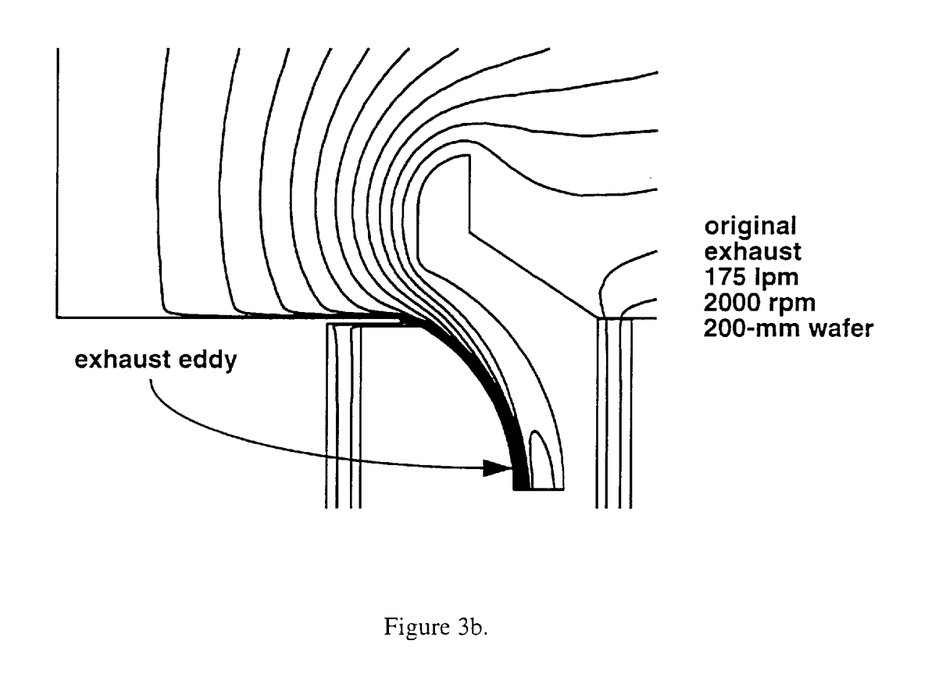
Figure 3C:
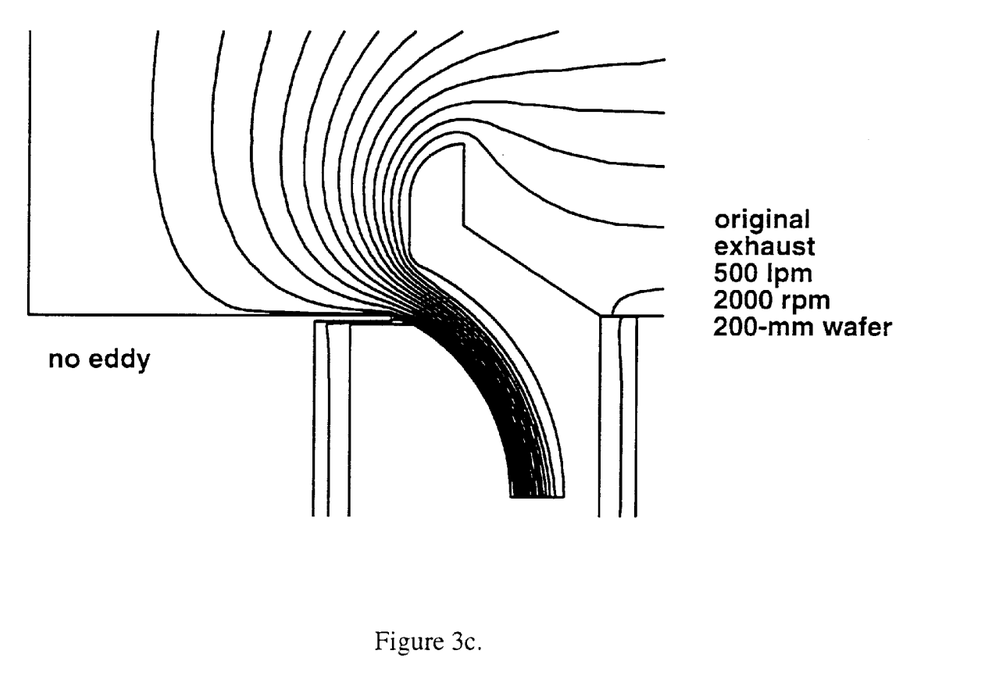
Figure 5A:
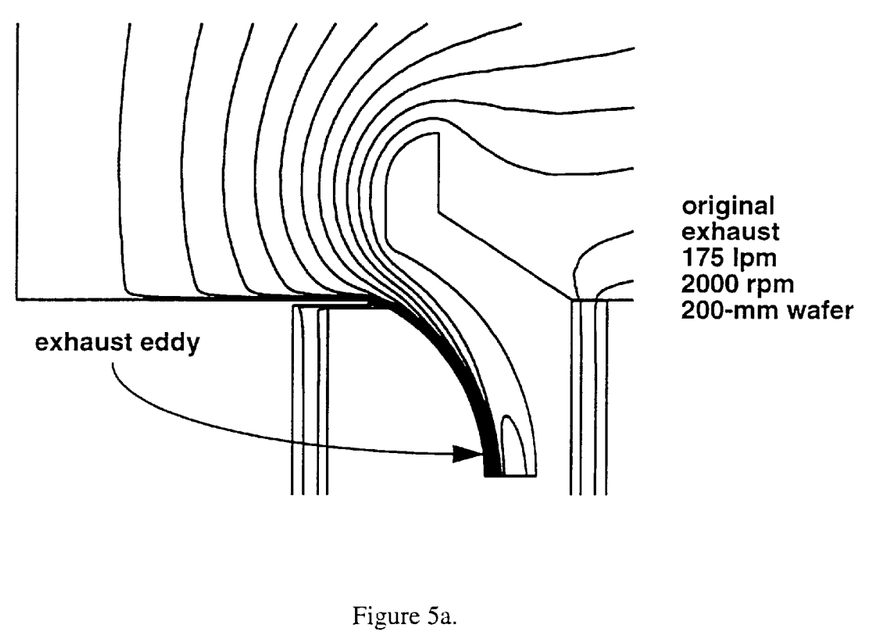
Figure 5B:
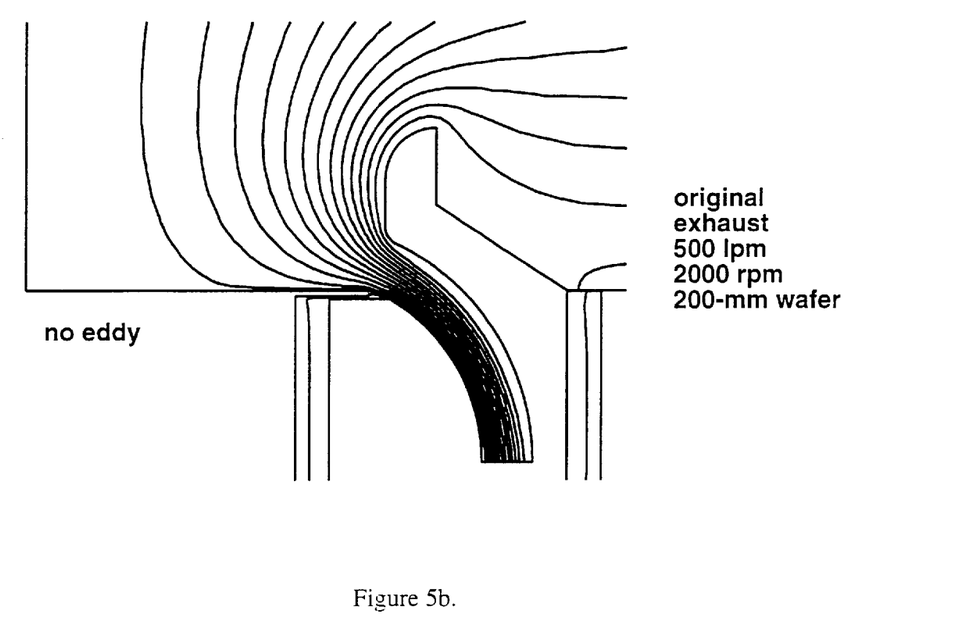
Figure 5C:
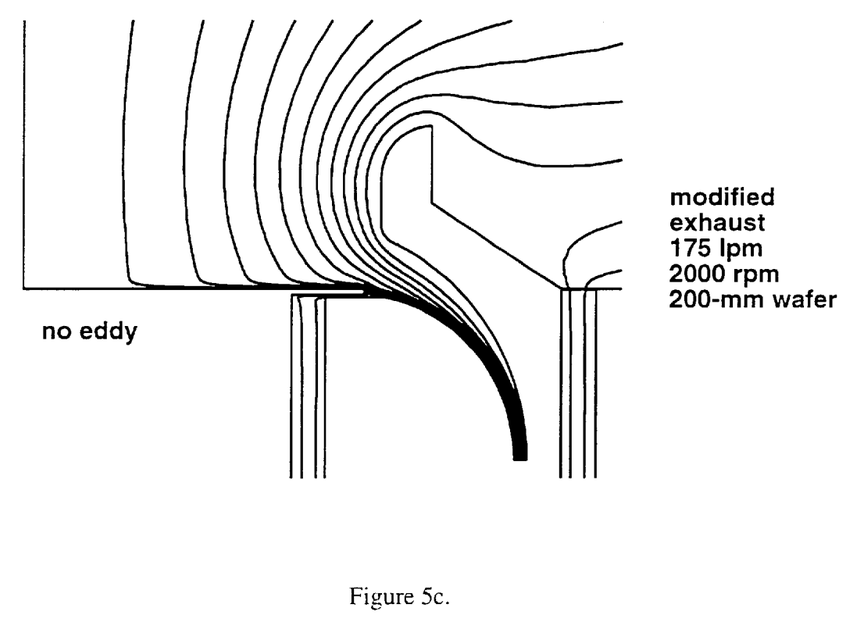

The avoidance of eddy formation can also constrain spin coater operation. At least two types of eddies are possible—wafer eddies and exhaust eddies—as illustrated in FIG. 3(a,b,c). FIG. 3a shows significant wafer and exhaust eddies in flow using a conventional exhaust outlet and low cleanroom air flow (110 lpm). FIG. 3b shows exhaust outlet eddies in flow using a conventional exhaust outlet and higher cleanroom air flow (175 lpm). FIG. 5c shows that eddy-free flow can be obtained using a conventional exhaust outlet with very high cleanroom air flow (500 lpm). Wafer eddies form over the wafer outer edge at low pumping rates; they are detrimental to process quality and contaminant transport to the environment. For nonzero rotation rates, these eddies can form at low pumping rates (low air flow rates) but can be absent at higher pumping rates. The process quality requirements constrain the pumping rate to be large enough to avoid the formation of wafer eddies.

Eddies can also form in the exhaust outlet. Higher pumping rates can shrink these exhaust eddies and can sometimes (but not always) remove them. Since all eddies serve as contamination sources, achieving eddy-free flow is desirable from the viewpoint of environments and process quality viewpoints.

Wafer eddy formation can be understood in terms of the centrifugal effect of wafer rotation on the adjacent air. Because of the effect of viscosity, a swirling component of velocity is imparted the wafer to the adjacent gas. This gas is centrifuged radially outward toward the outer edge of the wafer. The continual removal of the gas adjacent to the wafer draws gas toward the wafer. Since the gas drawn toward the wafer is nonrotating, its flow toward the wafer limit the thickness of the swirling layer of gas above the wafer. The boundary layer has a scale thickness $\delta$ given by Equation 2, a maximum axial velocity component $U_z$ (obtained outside the boundary layer) given by Equation 3, and a maximum radial velocity component $U_r$ (obtained inside the boundary layer) given by Equation 4.

$$\delta = \left(\frac{v}{\Omega}\right)^{1/2} \qquad \text{Equation 2}$$

$$U_z = 0.886(v\Omega)^{1/2} \qquad \text{Equation 3}$$

$$U_r = 0.181 r\Omega \qquad \text{Equation 4}$$

For a disk of radius $R >> \delta$, these relations determine the centrifugal volume flow rate as in Equation 5.

$$V'_{cent} = \pi R^2 \cdot U_z = \pi R^2 0.886(v\Omega)^{1/2} \qquad \text{Equation 5}$$

Figure 4:
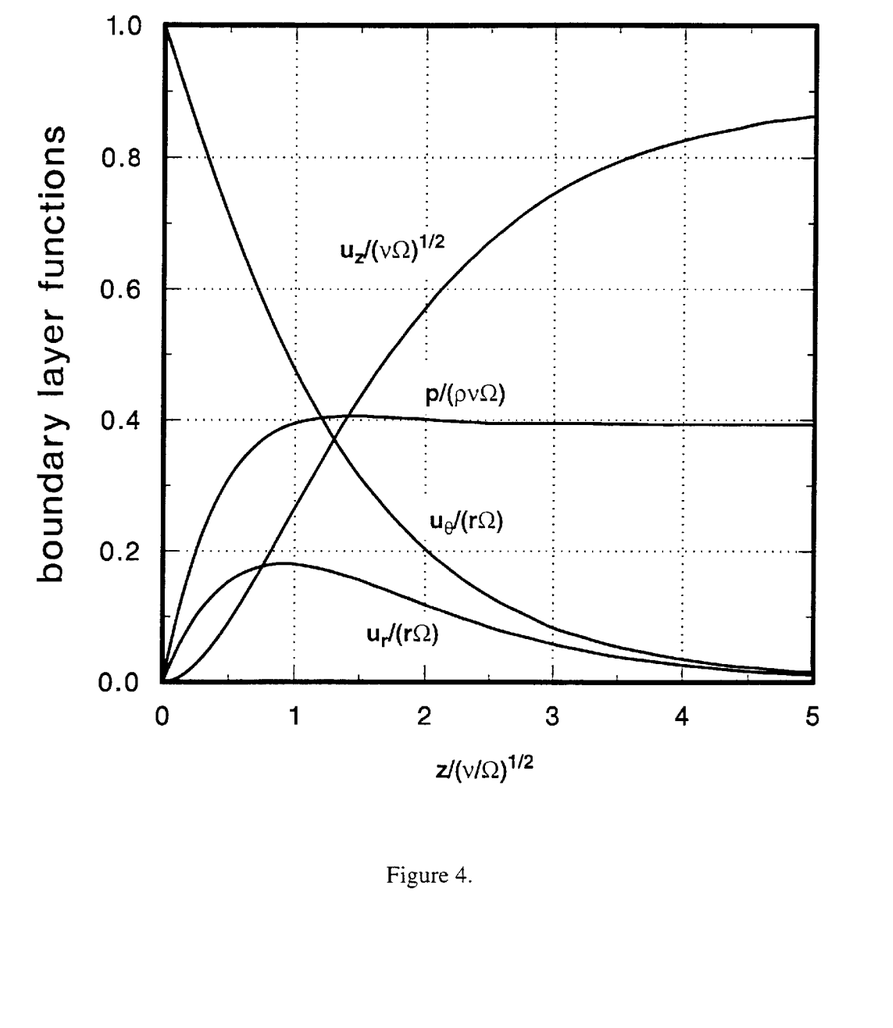
FIG. 4 is a graph of boundary layer functions for von Karman flow over a rotating disk.

A 200 mm wafer rotating at 4400 rpm in air has $\delta=183$ $\mu$m, $U_z=7.5$ cm/s, $U_r=8.3$ m/s, and $V'_{cent}=141$ lpm. FIG. 4 shows the detailed results for the variation of the velocity and pressure within the boundary layer in terms of the relations in Equation 6.

$$\zeta=z/\delta; u_r=\Omega r F(\zeta); u_\theta=r\Omega G(\zeta); u_z=(v\Omega)^{1/2}H(\zeta); p=\rho v\Omega P(\zeta) \qquad \text{Equation 6}$$

A necessary but not sufficient condition to prevent the formation of a wafer eddy is for the pumping to supply air at least as quickly as it is centrifuged away. If this criterion is not satisfied, the rotating disk centrifuges gas away from itself more rapidly than it is provided with gas by the pumping. This shortfall is made up by the formation of a wafer eddy, which returns a portion of the centrifuged gas back to the wafer surface. The discussion above presumes that the flow over the wafer remains laminar. If it becomes turbulent, the enhanced mixing would increase the centrifugal volume flow rate well above the value indicated by the relations of Equation 6.

A wafer eddy can also form adjacent to the underside of the wafer if a portion of this surface is open to flow. The eddy forms under exactly the same circumstances that produce a wafer eddy over the top surface of the wafer: when less air is pumped in than is centrifuged away. To prevent this, pumping must supply air more rapidly than it is centrifuged away. Since only a portion of the underside is open to flow, the underside flow rate can be somewhat less than $V'_{cent}$.

Exhaust eddy formation can be viewed similarly to wafer eddy formation. The centrifugal flow departs from the wafer edge in a two dimensional jet, a very thin sheet of high speed air. This jet can attach to and follow the inner wall of the exhaust outlet as it curves down toward the pump. Since the noncentrifugal flow occupying the remainder of the exhaust outlet is moving more slowly, some of this low speed flow is entrained by the high speed jet flow. The jet continues to entrain additional air until it has broadened sufficiently to fill the exhaust outlet, at which point it has entrained air at a volumetric flow rate of $V'_{ent}$. The entrainment volume flow rate can be difficult to estimate; it can depend on whether the jet flow remains laminar or becomes turbulent (turbulent flow can enhance entrainment). If sufficient air is not provided by the pumping rate, the jet entrains more air than is available to it, and an eddy forms to return some of the excess entrained air back upstream, where it is reentrained.

From the above discussion, it appears that eddy-free flow both above the wafer and in the exhaust outlet can be achieved if the pumping rate is sufficiently greater than the theoretical minimum pumping rate $V'_{min}$ for eddy-free flow: $V'_{pump} > V'_{min} = (1 \text{ to } 2) V'_{cent} + V'_{ent}$. The factor before $V'_{cent}$ is 1 if none of the wafer underside is open to flow, 2 if the wafer underside is completely open to flow, and some intermediate value for a partially open underside. In conventional practice, $V'_{pump}$ is typically required to be two to three times greater than the value of $V'_{min}$ to suppress eddy formation in the exhaust duct. However, under certain circumstances, exhaust eddy formation cannot be suppressed even by employing a pumping rate much larger than two to three times $V'_{min}$. Further increases of the pumping rate cause an eddy to form in the exhaust outlet by flow separating from the upstream corner of the inlet to the exhaust outlet. This eddy forms at high pumping rates because the noncentrifugal flow is moving too rapidly to remain attached as it turns to enter the inlet to the exhaust outlet. This eddy formation mechanism can be suppressed by contouring the inlet with as gentle a curvature as is practical.

MODELED GAS FLOW

The computational fluid dynamics code FIDAP® was used to perform simulations of a spin coater module to determine the minimum pumping rate for a given rotation rate at which eddy-free flow can be achieved. See Fluid Dynamics International, *FIDAP® Users Manual*, Evanston, Ill., 1993. The dominant effect of rotation, the thinness (compared to the extent of the domain) of the boundary layer over the wafer and the high speed jet formed thereby, the spurious upwinding-induced thickening of the boundary layer driving the flow, and the need to run large numbers of simulations in a timely fashion all rendered this a computationally challenging problem.

Figure 6:
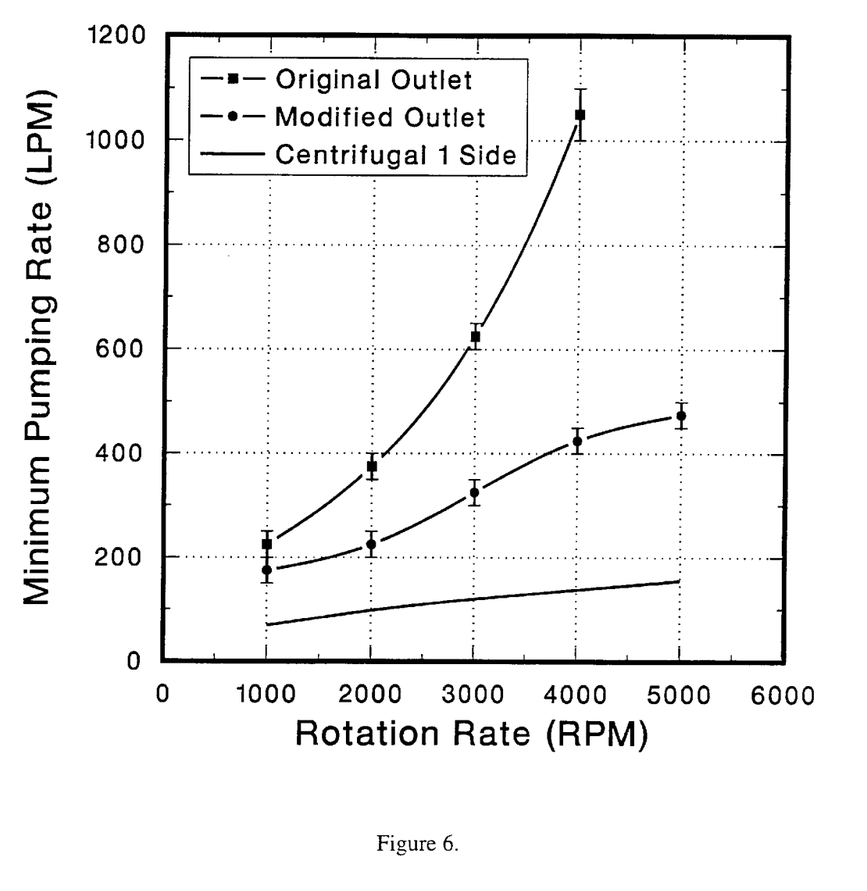
FIG. 6 is a graph of the minimum pumping rate to achieve eddy-free flow.

Two exhaust duct geometries were examined: a conventional exhaust duct geometry and an exhaust duct geometry according to the present invention. The exhaust duct geometry according to the present invention is similar to the conventional exhaust duct geometry, modified so that the exhaust duct tapers in cross section. In the simulation, the exhaust duct was tapered to follow the entrained streamlines determined for the conventional exhaust duct. Five rotation rates were examined for each exhaust duct geometry: 1000, 2000, 3000, 4000, and 5000 rpm, which span the usual operating range of a spin coater. For each exhaust duct geometry and each rotation rate, simulations were performed for various pumping rates to determine a narrow range bracketing the minimum pumping rate closely. FIG. 5(*a,b,c*) shows streamline plots from some of these simulations for cases with and without exhaust eddies, and FIG. 6 shows the minimum pumping rate for each exhaust duct geometry as a function of rotation rate.

The simulations confirmed the expected qualitative flow behavior discussed above and confirmed that eddy-free flow was obtained at much lower cleanroom air flow rates with the exhaust duct according to the present invention. A portion of the air entering the catch cup is drawn toward the wafer and centrifuged radially outward into the exhaust outlet and thence to the exhaust duct, and the remainder flows more directly into the exhaust outlet and thence to the exhaust duct. At low pumping rates (175 lpm), an eddy can be seen in the conventional exhaust duct, as shown in FIG. 5*a*. Eddy-free flow can be obtained in the conventional exhaust duct at very high pumping rates (500 lpm), as shown in FIG. 5*b*. This was true for all rotation rates except for the conventional exhaust duct geometry at 5000 rpm, where flow separation at the fairly sharp corner of the exhaust outlet produced an eddy at high pumping rates. In all cases without wafer eddies, the jet emanating from the wafer edge attached to the exhaust outlet wall that passes along the wafer underside, and the jet followed this wall as it curves into the exhaust duct. The jet entrained additional flow as it traveled down the exhaust duct, as can be seen in FIG. 5*a*: streamlines from the noncentrifuged portion of the flow merge smoothly into the jet. If the pumping is insufficient to supply both the centrifugal flow (both top side and underside) and the entrainment, as in the top plot of FIG. 5*a*, exhaust eddies form to supply the necessary additional flow by transporting downstream air back upstream.

In contrast, an exhaust duct geometry according to the present invention can be tapered to follow the entrained streamlines, preventing flow separation and eddy formation. More specifically, the tapering constrained the noncentrifuged flow to enter the jet at its natural entrainment rate. Eddy-free flow was obtained using an exhaust duct according to the present invention at low cleanroom air flow (175 lpm), flow that resulted in significant exhaust duct eddies in the conventional exhaust duct. No further exhaust duct tapering was required alter the jet spans the exhaust duct. As seen in FIG. 6, exhaust duct geometry according to the present invention requires significantly less pumping to maintain eddy-free flow, with the largest reduction coming at the highest rotation rate.

Figure 7:
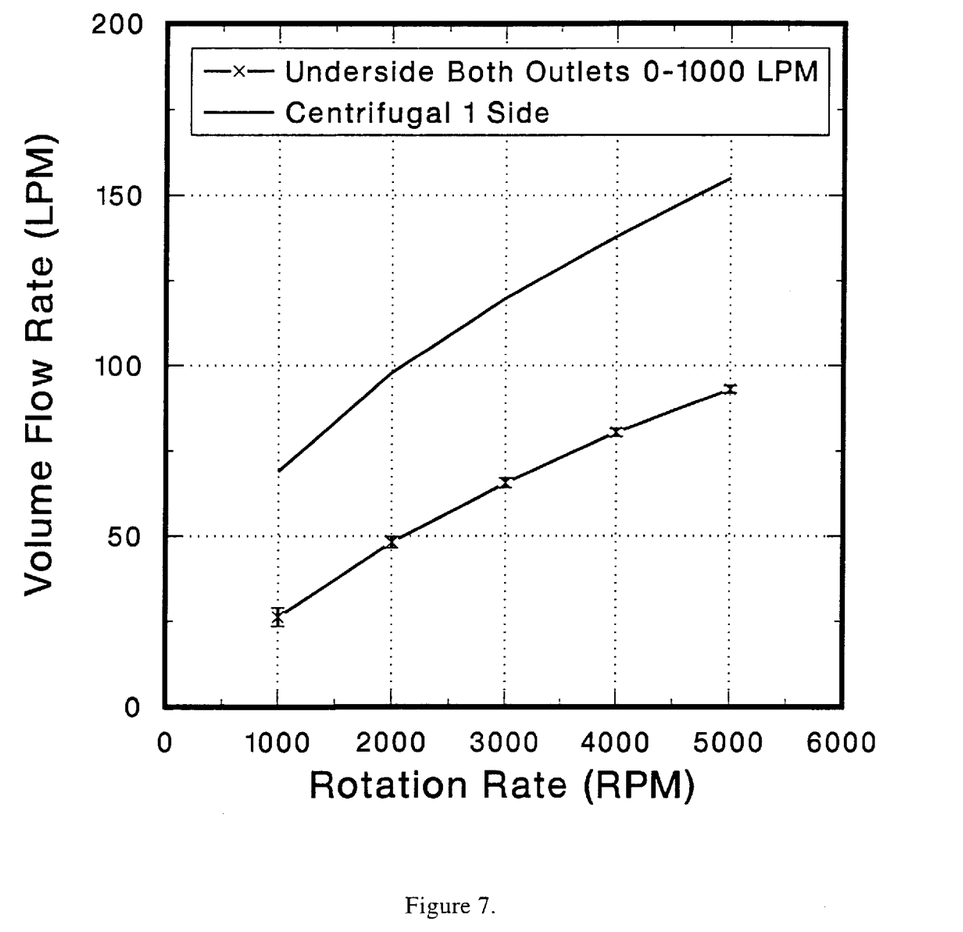
FIG. 7 is a graph of volume flow rate along the underside of a wafer.
Figure 9:
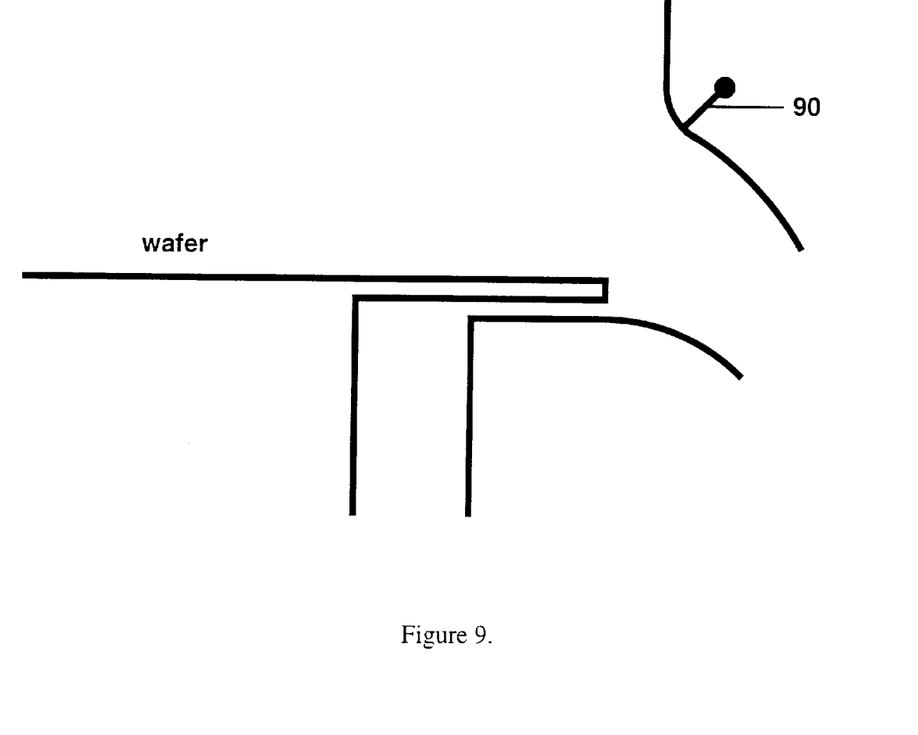
FIG. 9 is a sectional view of an exhaust duct geometry according to the present invention.

Several other features of flow behavior are elucidated by the simulations. First, the flow in the catch cup above the wafer depends strongly on the pumping and rotation rates but is essentially independent of the downstream details of the exhaust outlet geometry. This can be seen by comparing the streamlines in FIGS. 5*a* and 5*c*, which are virtually identical above the wafer. Therefore, modest modifications in the downstream portion of the exhaust duct are unlikely to affect process quality adversely since the flow over the wafer is virtually unchanged (process quality may be improved by reduced contaminant transport). Second, the flow along the underside of the wafer depends strongly on the rotation rate and the underside geometry but is fairly independent of the pumping rate and the downstream exhaust duct geometry. Although for these exhaust duct geometries only a small fraction of the underside area is open to flow, the centrifugal flow produced by the underside is a surprisingly large fraction of the flow that would be produced from a completely open underside, as shown in FIG. 7. Therefore, modification of the underside flow geometry can offer some reduction in air use. Third, the flow around the corner of the exhaust outlet is only marginally attached and is often on the verge of separating and producing an eddy. This can be seen from FIGS. 5*b* and 5*c*. For both of these cases, the streamlines adjacent to the exhaust outlet become widely spaced downstream of this corner ever for the geometry of the present invention, indicating low flow speeds, a neutral or adverse (decelerating) pressure gradient, and a flow that is only weakly attached. This phenomenon can be related to the sharpness of the exhaust outlet corner. Therefore, a gentler curvature 90, as shown in FIG. 9, in this region can offer a further reduction in air use. For example, a radius of curvature greater than about ¼ the height of the exhaust outlet can be used. A larger radius of curvature, such as, for example, ½ to 1 times the maximum height of the exhaust outlet can offer a further reduction in air use. Height of the exhaust outlet is the distance from the plane of the wafer in proximity to the wafer outer edge to the exhaust outlet corner, if the radius of curvature at the corner were zero.

Figure 8A:
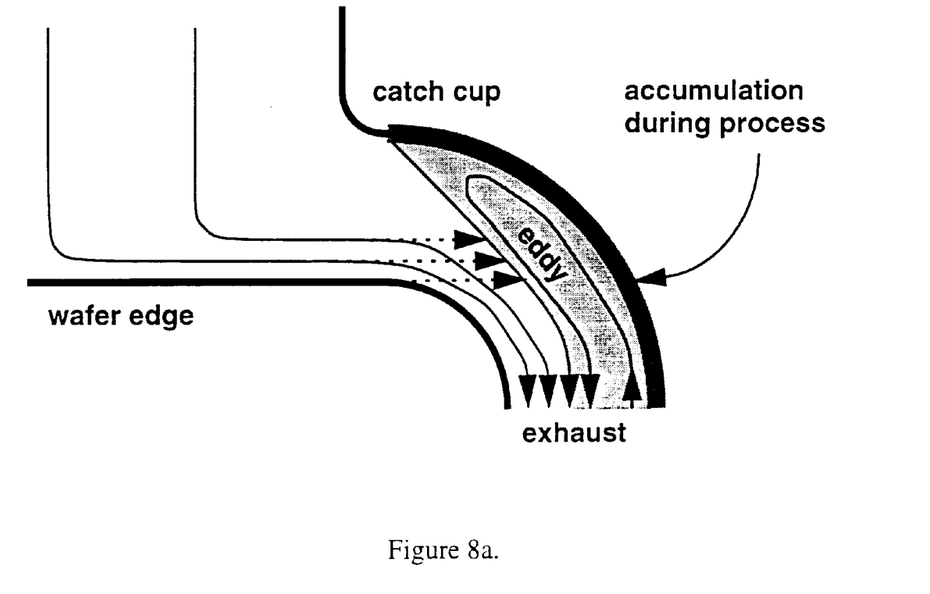
Figure 8B:
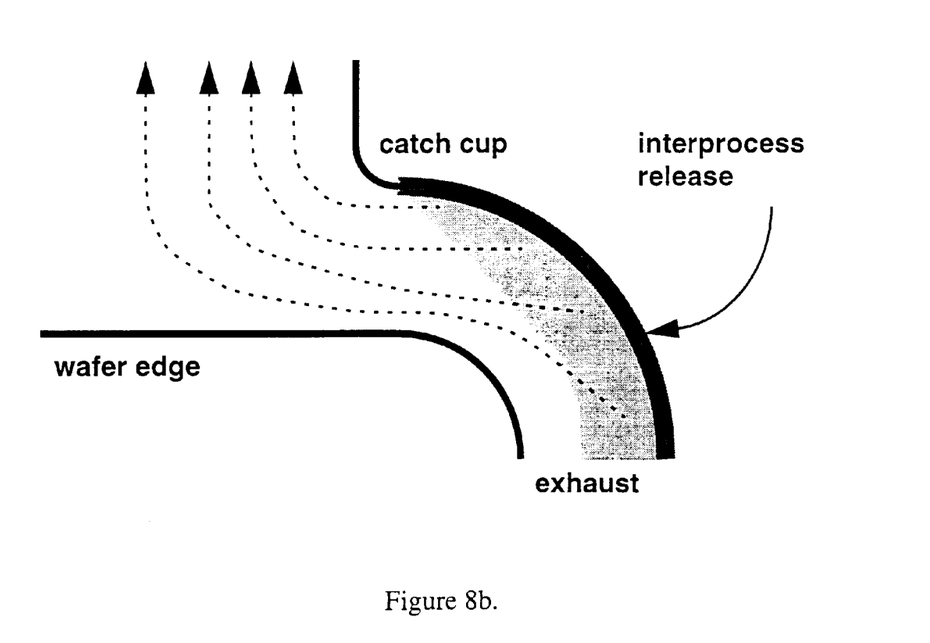

Gas-phase transport during the interprocess period is a possible mechanism to transfer contaminant from the spin coater to the environment. FIG. 8(*a,b*) shows a schematic diagram of this mechanism. If an exhaust eddy is present during the coating process, it can be a region of contaminant accumulation. This accumulation can be contaminant vapor or particles in the eddy and liquid or solid material adhering to the wall adjacent to the eddy. If pumping is decreased or halted during removal of the processed wafer and insertion of the next wafer, some of the contaminant stored in the eddy region is released to the environment. The rate of this release depends on how the contaminant is stored (for example, particles in the air or a liquid film on the wall), on the amount of time for the unloading-loading operation to be completed, and on the pumping rate during unloading and loading. It should be noted that maintaining pumping during unloading-loading may not completely prevent release of contaminant material stored in an eddy region. Regardless of whether pumping is maintained while the processed wafer is being unloaded, large eddies can form beneath the processed wafer as it is lifted out of the spin coater, and these eddies can store and rapidly transport contaminants from the catch cup to the environment. It is not clear whether pumping can completely suppress this mechanism of contaminant transport. Although pumping acts to confine any accumulated contaminant material in the eddy region, it also acts to strengthen the eddies beneath the wafer as it is removed. Thus mitigation of interprocess gas-phase contaminant transport to the environment is best accomplished by preventing exhaust eddies from forming in the first place so that there are no regions of contaminant accumulation during the coating process that can subsequently serve as contaminant sources during the interprocess period. The exhaust duct geometry of the present invention minimizes eddy formation, and consequently minimizes interprocess gas-phase contaminant transport to the environment.

Figure 10A:
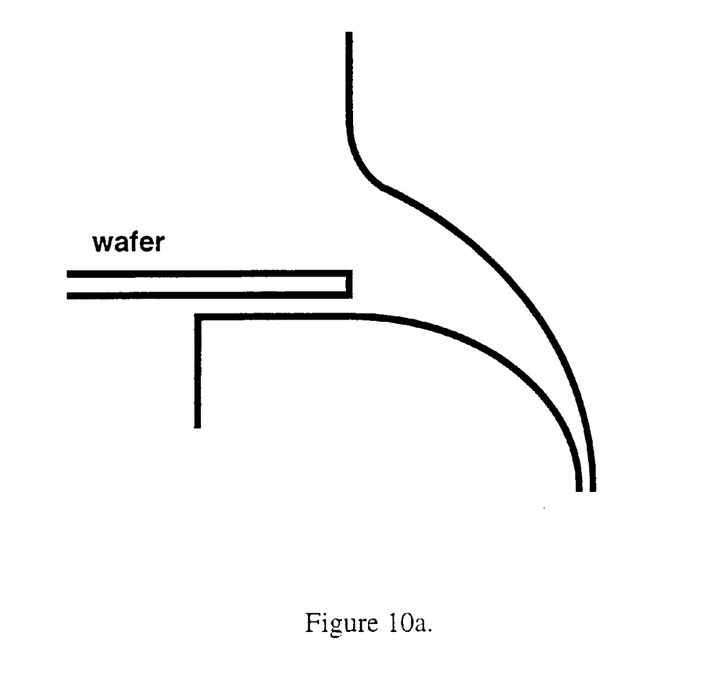
Figure 10B:
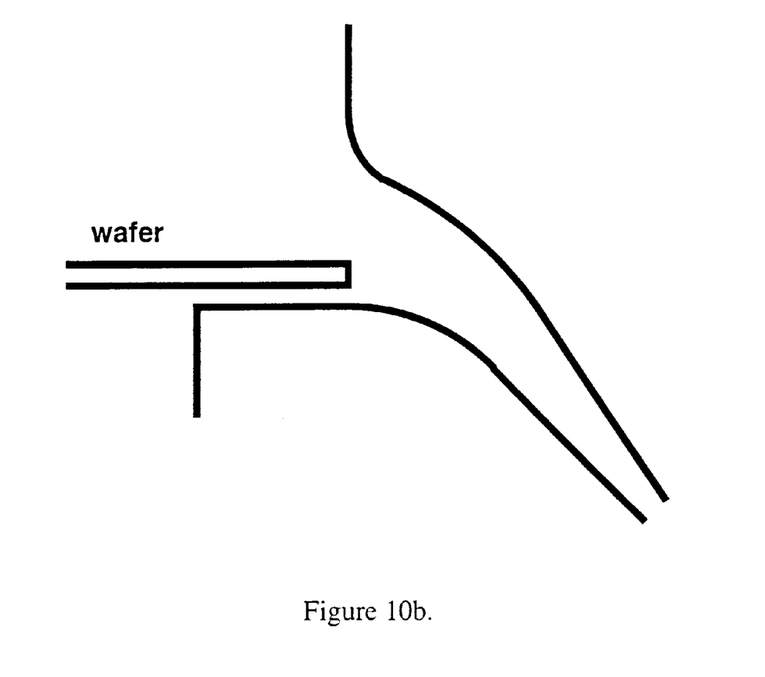

The present invention contemplates a variety of exhaust duct geometries compatible with eddy-free air flow therein. For example, FIG. 10(a,b) shows exhaust duct geometries according to the present invention. The volume and configuration available for the exhaust duct can be constrained by considerations such as overall spin coater size and shape, materials concerns, external connection requirements, and fabrication line integration. The exhaust duct cross-section can reduce over part of the exhaust gas flow path, from a maximum near the exhaust outlet to a lesser area a distance away from the exhaust outlet. The reduced cross-section, like that in FIG. 5c, can prevent eddy formation in the exhaust duct at lower required air flow rates than for conventional exhaust duct geometries.

The particular sizes and equipment discussed above are cited merely to illustrate particular embodiments of the invention. It is contemplated that the use of the invention may involve components having different sizes and characteristics. It is intended that the scope of the invention be defined by the claims appended hereto.

I claim:

1. An apparatus for spin coating, comprising:
   a) a chuck adapted to hold and rotate a wafer, such that said wafer defines a plane and an outer edge;
   b) a catch cup substantially surrounding said outer edge, and defining an exhaust port in proximity to said outer edge; and
   c) an exhaust duct extending from said exhaust port away from said outer edge to an external exhaust, wherein said exhaust duct defines an exhaust gas flow path, and wherein said exhaust duct has a cross sectional area measured substantially orthogonal to said exhaust gas flow path, and wherein said cross sectional area decreases from a maximum near said plane to a reduced value at a second point along said exhaust gas flow path, and wherein said exhaust duct comprises an outer wall distal from the rotational axis of said wafer, and wherein said outer wall comprises a first portion substantially perpendicular to said plane and a second portion substantially parallel to said plane, and wherein said first portion forms a connection with said second portion in proximity to said outer edge with a radius of curvature at least ¼ the height above said plane of said connection.

2. The apparatus for spin coating of claim 1, wherein said exhaust duct cross section smoothly tapers from said first point to said second point.

3. The spin coating apparatus of claim 1, wherein said exhaust duct comprises an outer wall distal from the rotational axis of said wafer, and wherein said outer wall comprises a first portion substantially perpendicular to said plane and a second portion substantially parallel to said plane, and wherein said first portion connects with said second portion in proximity to said outer edge with a radius of curvature at least ½ the height above said plane of said connection.

4. The spin coating apparatus of claim 1, wherein said exhaust duct comprises an outer wall distal from the rotational axis of said wafer, and wherein said outer wall comprises a first portion substantially perpendicular to said plane and a second portion substantially parallel to said plane, and wherein said first portion connects with said second portion in proximity to said outer edge with a radius of curvature at least at least equal to the height above said plane of said connection.

5. The apparatus for spin coating of claim 1, wherein said exhaust duct smoothly decreases in a shape that prevents eddy formation at exhaust gas flow rates of less than twice the minimum gas flow rate required to satisfy jet entrainment by centrifugal air flow over said wafer.

6. The apparatus for spin coating of claim 1, wherein said exhaust duct comprises an inner wall proximal to the axis of rotation of said wafer and on outer wall distal from the axis of rotation of said wafer, wherein said inner wall comprises a shape that extends from said exhaust port in an initial direction substantially parallel to exhaust gas flow from the surface of said wafer, and wherein said inner wall shape defines an entrainment streamline, and wherein said outer wall is substantially coincident with said entrainment streamline.

* * * * *